(12) United States Patent
Yen

(10) Patent No.: US 6,673,712 B1
(45) Date of Patent: Jan. 6, 2004

(54) METHOD OF FORMING DUAL-IMPLANTED GATE AND STRUCTURE FORMED BY THE SAME

(75) Inventor: Benny Yen, Taipei (TW)

(73) Assignee: ProMos Technologies Inc., Hsinchu (TW)

( * ) Notice: Subject to any disclaimer, the term of this patent is extended or adjusted under 35 U.S.C. 154(b) by 0 days.

(21) Appl. No.: 10/064,372

(22) Filed: Jul. 8, 2002

(51) Int. Cl.⁷ .................... H01L 21/4763; H01L 21/44
(52) U.S. Cl. .................... 438/633; 438/672; 438/674
(58) Field of Search ........................ 438/585, 633, 438/645, 672, 674, 699, 692

(56) References Cited

U.S. PATENT DOCUMENTS 6,156,651 A * 12/2000 Havemann ............... 438/674
6,215,190 B1 * 4/2001 Bruce et al. ............. 257/640
6,258,711 B1 * 7/2001 Laursen ................... 438/633

* cited by examiner

Primary Examiner—John F. Niebling
Assistant Examiner—Walter L. Lindsay, Jr.
(74) Attorney, Agent, or Firm—Jiang Chyun IP Office

(57) ABSTRACT

A method of forming a dual-implanted gate and a structure formed by the same. Stack structures comprising a polysilicon layer, a sacrificial layer and a mask layer are formed over a substrate with a gate oxide layer thereon. A dielectric layer is formed over the substrate covering the stack structures. The dielectric layer is planarized to expose the upper surface of the mask layer in the first and the second structure. The mask layer is removed to form a plurality of trenches. The stack structures are selectively implanted using ions having different electrical states. The sacrificial layer is removed. Thereafter, a barrier layer is formed over the interior surface of the trenches. A metallic layer is formed over the substrate completely filling the trenches. The dielectric layer is removed to form a plurality of gate structures. Spacers may on the sidewalls of the gate structures as well.

18 Claims, 5 Drawing Sheets

METHOD OF FORMING DUAL-IMPLANTED GATE AND STRUCTURE FORMED BY THE SAME

BACKGROUND OF INVENTION

1. Field of Invention

The present invention relates to a method of forming a semiconductor device and a structure formed by the same. More particularly, the present invention relates to a method of forming a dual-implanted gate and a structure formed by the same.

2. Description of Related Art

At present, the gate of most semiconductor devices has a stack structure that includes a doped polysilicon layer and a metallic layer or a metal silicide layer. To manufacture a semiconductor device having both n-doped and p-doped polysilicon gates, the so-called "dual-implanted gate", polysilicon material is first deposited over a substrate. An ion implantation is carried out to implant ions into the substrate such that n-type dopants are implanted into NMOS region and p-type dopants are implanted into PMOS region. Thereafter, a layer of tungsten or tungsten silicide ($WSi_x$) is formed over the doped polysilicon layer. Finally, an etching operation is conducted to pattern out a dual-implanted gate structure.

However, the deposition of tungsten or tungsten silicide over the polysilicon layer often leads to an out-diffusion of dopant ions. This is because the grain boundary of the tungsten or tungsten silicide layer is relatively large. Hence, the n-type or p-type ions within the doped polysilicon layer can easily diffuse through the tungsten or tungsten silicide layer into another polysilicon layer. Under such circumstances, the concentration of dopants within the polysilicon layer is likely to drop, leading to a degradation of device performance.

In addition, if a tungsten layer is formed over the polysilicon layer, difference in material properties between tungsten and polysilicon may lead to the production of gates having an irregular shape after patterning through an etching operation. Similarly, due to a difference in material properties between tungsten and polysilicon, the tungsten layer may peel off from the doped polysilicon layer after a subsequent thermal processing operation.

SUMMARY OF INVENTION

Accordingly, one object of the present invention is to provide a method of forming a dual-implanted gate capable of preventing doped ions having different electrical states from cross diffusing through an overhead metallic layer.

A second object of this invention is to provide a method of forming a dual-implanted gate capable of preventing any change in concentration of doped ions inside a doped polysilicon layer.

A third object of this invention is to provide a method of forming a dual-implanted gate and a structure formed by the same, which is capable of preventing the degradation of device performance.

A fourth object of this invention is to provide a method of forming a dual-implanted gate and a structure formed by the same, which is capable of preventing the formation of gates having an irregular shape.

A fifth object of this invention is to provide a method of forming a dual-implanted gate and a structure formed by the same, which is capable of preventing an overhead metallic layer from peeling off a doped polysilicon layer.

To achieve these and other advantages and in accordance with the purpose of the invention, as embodied and broadly described herein, the invention provides a method of forming a dual-implanted gate. The method includes the following steps. First, a substrate having a gate oxide layer thereon is provided. A polysilicon layer, a sacrificial layer and a mask layer are sequentially formed over the substrate. The polysilicon layer, the sacrificial layer and the mask layer are patterned to form a first structure for forming an N-type gate and a second structure for forming a P-type gate. A dielectric layer is formed over the substrate covering the first and the second structure. The dielectric layer is planarized to expose the upper surface of the mask layer in the first and the second structure. The mask layer is removed to form a plurality of trenches. The first and the second structure are implanted using ions having different electrical states. The sacrificial layer is removed. Thereafter, a barrier layer is formed over the substrate. A metallic layer is formed over the substrate completely filling the trenches. The metallic layer is planarized to remove excess metal outside the trench. The exposed barrier layer is removed and then the dielectric layer is removed to form a plurality of gate structures. Finally, spacers may form on the sidewalls of the gate structures.

In this invention, a barrier layer is formed over the doped polysilicon layer before forming the metallic layer. Thus, dopants having different electrical states within the doped polysilicon layer are prevented from cross diffusing with the overhead metallic layer. Hence, changes in dopant concentration within the doped polysilicon layer and the peeling of the metallic layer away from the doped polysilicon layer are prevented. Ultimately, device performance can be maintained. Furthermore, by enclosing the sidewall of the metallic layer with a barrier layer, the formation of irregular-shaped gates due to a difference in material properties between the metallic layer and the polysilicon layer is largely avoided.

To achieve these and other advantages and in accordance with the purpose of the invention, as embodied and broadly described herein, the invention provides a dual-implanted gate. The dual-implanted gate includes a stack structure and a spacer on a substrate. The stack structure includes a polysilicon bottom layer, a barrier layer and a metallic layer, the metallic layer being surrounding by the barrier layer. The spacer is formed on the stack layer over the substrate and the stack structure is enclosing by the spacer.

To achieve these and other advantages and in accordance with the purpose of the invention, as embodied and broadly described herein, the invention provides a dual-implanted gate. The dual-implanted gate includes a plurality of stack structures and a spacer on a plurality of corresponding spacers. The stack structure includes a polysilicon bottom layer, a barrier layer and a metallic layer, the metallic layer being surrounding by the barrier layer. The spacer is formed on the stack layers over the substrate and each of the stack structure is enclosed by the corresponding one of the spacers.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
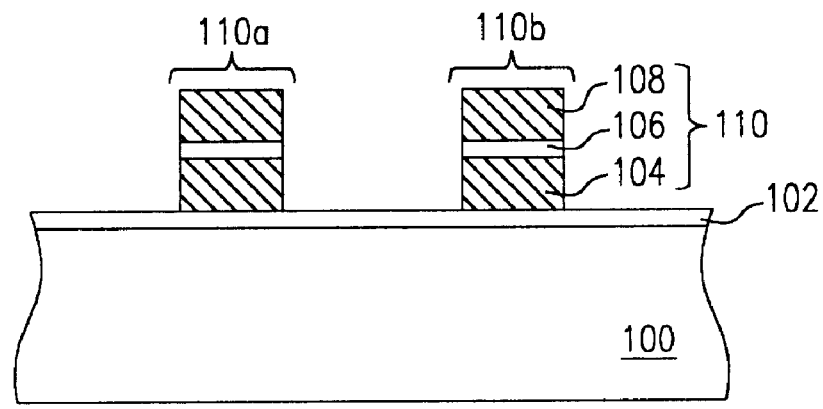
FIGS. 1A to 1J are schematic cross-sectional views showing the progression of steps for producing a dual-implanted gate according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1J are schematic cross-sectional views showing the progression of steps for producing a dual-implanted gate according to one preferred embodiment of this invention. As shown in FIG. 1A, a substrate 100 having a gate oxide layer 102 thereon is provided. A plurality of stack structures 110 each having a polysilicon layer 104, a sacrificial (SAC) layer 106 and a mask layer 108 is formed over the gate oxide layer 102. The sacrificial layer 106 can be an oxide layer and the mask layer can be a polysilicon layer or other material having a high etching selectivity relative to a subsequently formed dielectric layer, for example. The stack structure 110 is formed, for example, by a series of deposition processes to form a polysilicon layer, a sacrificial layer and a mask layer sequentially over the substrate 100. Thereafter, the polysilicon layer, the sacrificial layer and the mask layer are patterned to form a first structure 110a for implanting p-type dopants and a second structure 110b for implanting n-type dopants.

Figure 1B:
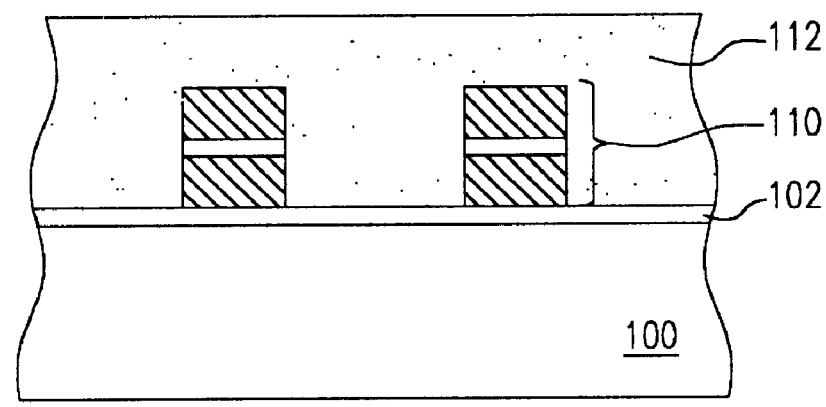

As shown in FIG. 1B, a dielectric layer is formed over the substrate 100 covering the stack structure 110. The dielectric layer 112 can be a silicon nitride layer, silicon oxide layer or other material having a high etching selectivity ratio relative to the mask layer 108, for example.

Figure 1C:
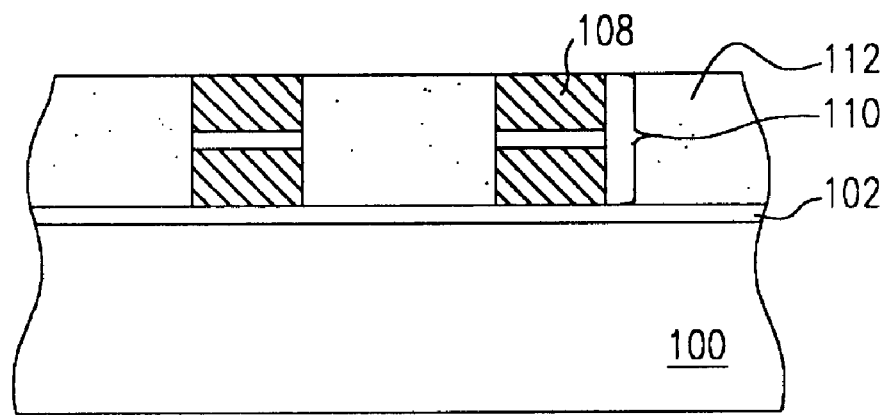

As shown in FIG. 1C, the dielectric layer 112 is planarized to expose the upper surface of the mask layer 108 within the stack structures 110, for example, by conducting a chemical-mechanical polishing (CMP) operation.

Figure 1D:
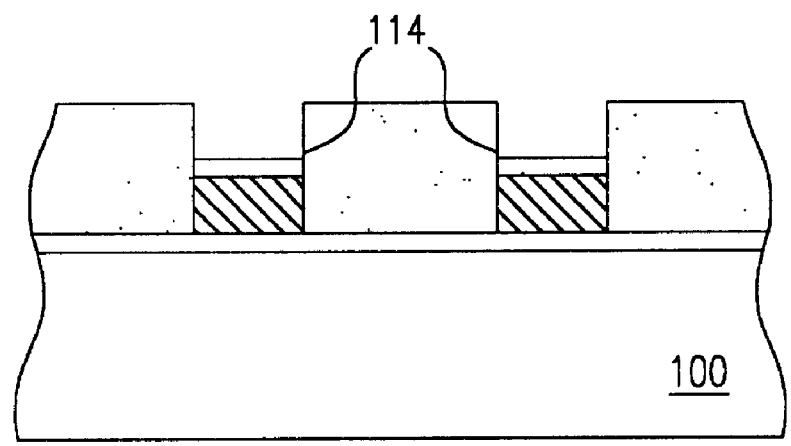

As shown in FIG. 1D, the mask layer 108 is removed to form a plurality of trenches 114. The mask layer 108 can be removed by dry etching, for example.

Figure 1E:
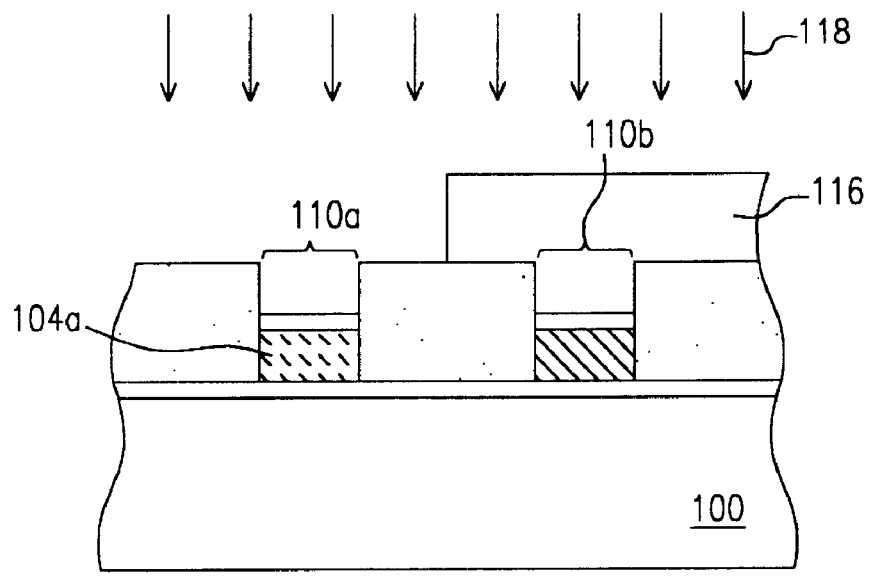

As shown in FIG. 1E, a patterned photoresist layer 116 is formed over the substrate 100 so that the second structure 110b for receiving n-type dopants is covered while the first structure 110a for receiving p-type dopants is exposed. Thereafter, an ion implantation 118 is carried out implanting p-type ions into first structure 110a so that the polysilicon layer 104 is converted into a p-doped polysilicon layer 104a. The p-type dopants include boron or boron difluoride ($BF_2$) ions for example.

Figure 1F:
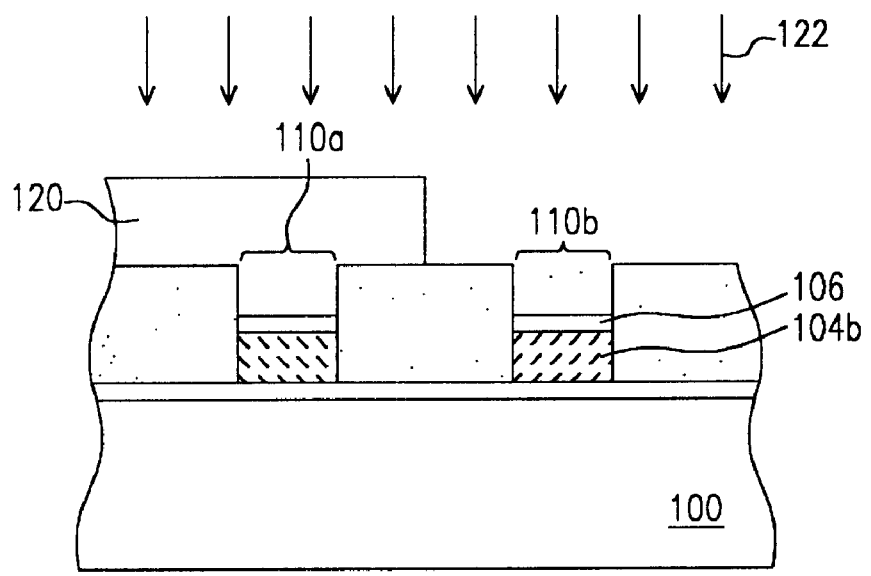

As shown in FIG. 1F, the photoresist layer 116 is removed. Another patterned photoresist layer 120 is formed over the substrate 100 such that the first structure 110a is covered while the second structure 110b for receiving n-type dopants is exposed. Thereafter, another ion implantation 122 is carried out implanting n-type ions into the second structure 110b so that the polysilicon layer 104 is converted into an n-doped polysilicon layer 104b. The n-type dopants include phosphorus or arsenic, for example.

Figure 1G:
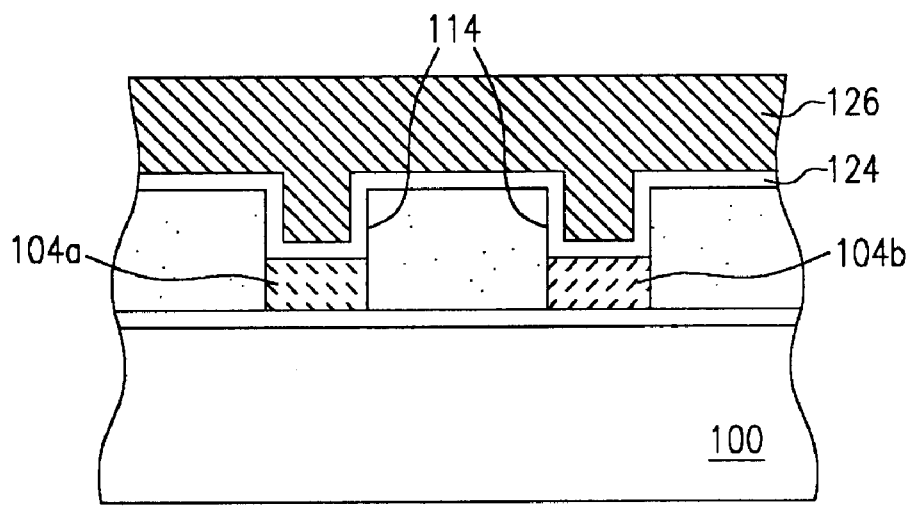

As shown in FIG. 1G, the photoresist layer 120 is removed. Thereafter, the sacrificial layer 106 is removed. A barrier layer 124 is formed over the substrate 100. The barrier layer 124 can be a composite layer such as a titanium/titanium nitride (Ti/TiN) layer. An annealing operation such as a rapid thermal process (RTP) may be conducted to lower the contact resistance with a subsequently formed overhead metallic layer. A metallic layer 126 is formed over the substrate 100 completely filling the trenches 114. The metallic layer can be a tungsten layer, for example. The barrier layer 124 between the metallic layer 126 and the doped polysilicon layers 104a and 104b prevents n-type or p-type ions from diffusing into another polysilicon layer through the metallic layer 126. In other words, the barrier layer 124 is an effective barrier to the out-diffusion of dopants.

Figure 1H:
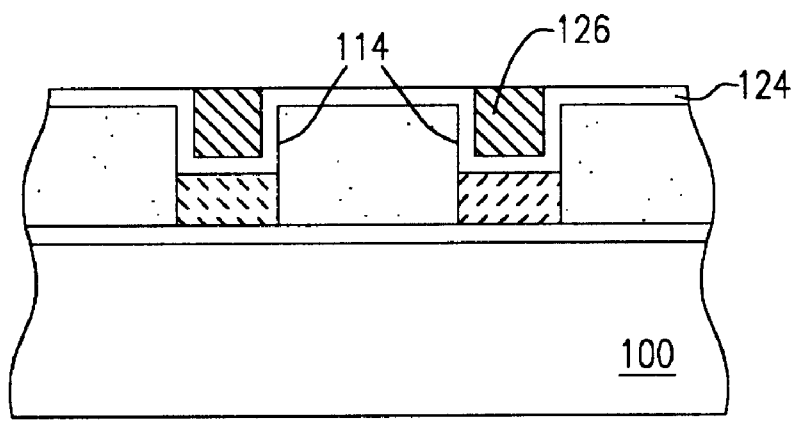

As shown in FIG. 1H, the metallic layer 126 is planarized using the barrier layer 124 as an etching end point. This removes the metallic layer 126 above the trenches 114. The metallic layer 126 is planarized by chemical-mechanical polishing, for example.

Figure 1I:
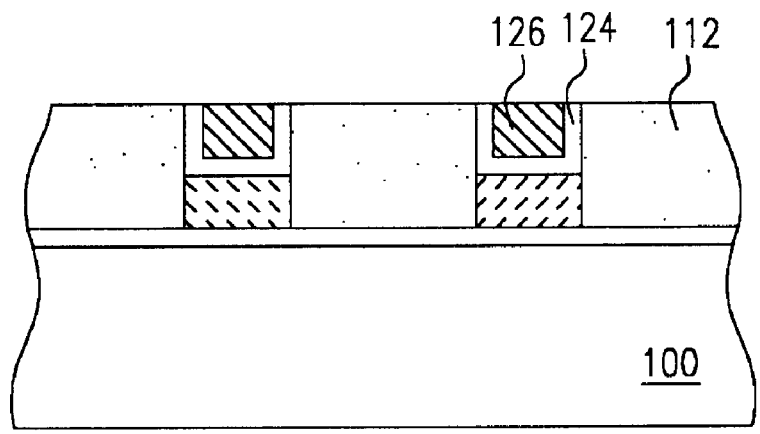

As shown in FIG. 1I, the exposed barrier layer 124 is removed so that the upper surface of the dielectric layer 112 is exposed. Similarly, the barrier layer 124 may be removed by chemical-mechanical polishing.

Figure 1J:
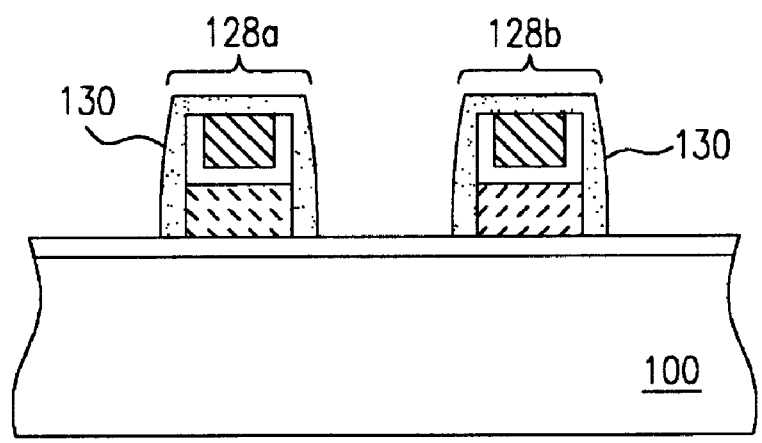

As shown in FIG. 1J, the dielectric layer 112 is removed to form a p-doped gate structure 128a and an n-doped gate structure 128b. Finally, spacers 130 are formed on the sidewalls of the gate structures 128a and 128b. The spacers 130 can be a silicon nitride layer, for example.

In conclusion, major aspects of this invention includes:
1. A barrier layer is formed over the doped polysilicon layer before depositing metallic material to form the metallic layer. Hence, dopants having different electrical properties are prevented from out-diffusing from the doped polysilicon layer through the metallic layer and vice versa.
2. Since the barrier layer between the doped polysilicon layer and the metallic layer prevents any cross-diffusion of n-type or p-type ions, dopant concentration within various doped polysilicon layers can be maintained.
3. Without out-diffusion of dopants, device performance is reliable.
4. By enclosing the sidewall of the metallic layer with a barrier layer, irregularity in gate profile due to a difference in material properties between the metallic layer and the polysilicon layer is prevented.
5. Because the metallic layer and the doped polysilicon layer are separated from each other by a barrier layer, the metallic layer is prevented from peeling away from an underlying doped polysilicon layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual-implanted gate on a substrate having a gate oxide layer thereon, comprising the steps of:

forming a plurality of stack structures on the substrate, wherein each stack structure belongs to a first group or a second group and each stack structure includes a polysilicon layer, a sacrificial layer and a mask layer;

forming a dielectric layer over the substrate covering the stack structures;

planarizing the dielectric layer to expose the upper surface of the mask layer within the stack structures;

removing the mask layer to form a plurality of trenches;

conducting a first ion implantation to implant first type ions into the stack structures belonging to the first group;

conducting a second ion implantation to implant second type ions into the stack structures belonging to the second group;

removing the sacrificial layer;

forming a barrier layer over the substrate covering the interior surface of the trenches;

forming a metallic layer over the substrate completely filling the trenches;

removing the metallic layer and barrier layer above and beyond the trenches; and removing the dielectric layer to form gate structures.

2. The method of claim 1, wherein the step of forming a plurality of stack structures on the substrate further includes the sub-steps of:

sequentially forming a polysilicon layer, a sacrificial layer and a mask layer over the substrate; and patterning the polysilicon layer, the sacrificial layer and the mask layer.

3. The method of claim 1, wherein the metallic layer includes a tungsten layer.

4. The method of claim 1, wherein the sacrificial layer includes an oxide layer.

5. The method of claim 1, wherein the barrier layer includes a titanium/titanium nitride composite layer.

6. The method of claim 1, wherein material constituting the mask layer includes a material having a high etching selectivity ratio relative to the dielectric layer.

7. The method of claim 1, wherein the mask layer is made from polysilicon and the dielectric layer is made from silicon oxide.

8. The method of claim 1, wherein the step of planarizing the dielectric layer includes chemical-mechanical polishing.

9. The method of claim 1, wherein after the step of forming the gate structures further includes forming spacers on the sidewalls of the gate structures.

10. The method of claim 1, wherein the first type ions includes p-type ions and the second type ions includes n-type ions.

11. The method of claim 1, wherein after the step of forming the barrier layer over the substrate, further includes conducting an annealing operation.

12. The method of claim 11, wherein the annealing operation includes a rapid thermal process.

13. A method of forming a dual-implanted gate, comprising the steps of:

forming a plurality of stack structures on a substrate, wherein each stack structure comprises a polysilicon bottom layer and a sacrificial top layer;

forming a dielectric layer over the substrate between the stack structures, wherein the upper surface of the dielectric layer is at a level higher than the upper surface of the stack structures so that a trench structure is formed above the stack structures;

covering a portion of the stack structures and conducting a first ion implantation to implant p-type ions;

covering the p-type ion implanted stack structures to expose the other stack structures and conducting a second ion implantation to implant n-type ions;

removing the sacrificial top layer;

forming a barrier layer on the interior surface of the trenches;

forming a metallic layer in the trenches; and removing the dielectric layer to form a plurality of gate structures.

14. The method of claim 13, wherein the metallic layer includes a tungsten layer.

15. The method of claim 13, wherein after forming the gate structures, further includes forming spacers on the sidewalls of the gate structures.

16. The method of claim 13, wherein the barrier layer includes a titanium/titanium nitride composite layer.

17. The method of claim 13, wherein after forming the barrier layer over the substrate, further includes conducting an annealing operation.

18. The method of claim 17, wherein the annealing operation includes a rapid thermal process.

* * * * *